(12) United States Patent
Iwasaki et al.

(10) Patent No.: US 8,188,471 B2
(45) Date of Patent: May 29, 2012

(54) FIELD EFFECT TRANSISTOR

(75) Inventors: Tatsuya Iwasaki, Machida (JP); Naho Itagaki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 240 days.

(21) Appl. No.: 12/671,052

(22) PCT Filed: Aug. 29, 2008

(86) PCT No.: PCT/JP2008/066021
§ 371 (c)(1),
(2), (4) Date: Jan. 28, 2010

(87) PCT Pub. No.: WO2009/031634
PCT Pub. Date: Mar. 12, 2009

(65) Prior Publication Data
US 2010/0258794 A1   Oct. 14, 2010

(30) Foreign Application Priority Data

Sep. 5, 2007 (JP) ................................. 2007-230381
Jun. 4, 2008 (JP) ................................. 2008-146890

(51) Int. Cl.
*H01L 29/04* (2006.01)
(52) U.S. Cl. ........ 257/57; 257/43; 257/72; 257/E29.079
(58) Field of Classification Search ................. 257/43, 257/57, 72, E29.079
See application file for complete search history.

(56) References Cited

U.S. PATENT DOCUMENTS

| | | | |
|---|---|---|---|
| 7,411,209 B2 | 8/2008 | Endo et al. | 257/43 |
| 7,569,856 B2 * | 8/2009 | Konuma et al. | 257/66 |
| 2006/0108636 A1 | 5/2006 | Sano et al. | 257/347 |
| 2007/0052025 A1 | 3/2007 | Yabuta | 257/347 |
| 2007/0108446 A1 | 5/2007 | Akimoto | 257/61 |
| 2007/0194379 A1 | 8/2007 | Hosono et al. | 257/347 |
| 2008/0272370 A1 | 11/2008 | Endo et al. | 257/43 |
| 2009/0065771 A1 | 3/2009 | Iwasaki et al. | 257/43 |
| 2009/0134427 A1 | 5/2009 | Oike et al. | 257/103 |
| 2009/0174012 A1 | 7/2009 | Iwasaki | 257/410 |
| 2009/0189153 A1 | 7/2009 | Iwasaki et al. | 257/43 |
| 2009/0269880 A1 | 10/2009 | Itagaki et al. | 438/104 |

FOREIGN PATENT DOCUMENTS

CN         1998087 A        7/2007
(Continued)

OTHER PUBLICATIONS

B. Yaglioglu et al., "High-mobility amorphous $In_2O_3$-10 wt % ZnO thin film transistors," Applied Physics Letters, vol. 89, p. 062103 (2006).

K. Nomura et al., "Room-temperature fabrication of transparent flexible thin-film transistors using amorphous oxide semiconductors," Nature, vol. 432, pp. 488-492 (Nov. 25, 2004).

(Continued)

*Primary Examiner* — Tan N Tran
(74) *Attorney, Agent, or Firm* — Fitzpatrick, Cella, Harper & Scinto

(57) ABSTRACT

A field effect transistor is provided including a gate electrode (for example, 15), a source electrode (13), a drain electrode (14) and a channel layer (11) to control current flowing between the source electrode (13) and the drain electrode (14) by applying a voltage to the gate electrode (15). The channel layer (11) is constituted of an amorphous oxide containing In and Si and having a compositional ratio expressed by Si/(In+Si) of not less than 0.05 and not more than 0.40.

10 Claims, 6 Drawing Sheets

FOREIGN PATENT DOCUMENTS

| | | |
|---|---|---|
| JP | 8-264021 A | 10/1996 |
| JP | 2004-050643 A | 2/2004 |
| WO | WO 2004/038757 A2 | 5/2004 |
| WO | WO 2005/093846 A1 | 10/2005 |
| WO | WO 2005/093848 A1 | 10/2005 |
| WO | WO 2007/086291 A1 | 8/2007 |
| WO | WO 2007/108293 A1 | 9/2007 |

OTHER PUBLICATIONS

R.E. Presley et al., "Transparent ring oscillator based on indium gallium oxide thin-film transistors," Solid-State Electronics, vol. 50, pp. 500-503 (2006).

* cited by examiner

A) Si/(In+Si)=0.12
B) Si/(In+Si)=0.18
C) Si/(In+Si)=0.23
D) Si/(In+Si)=0.30
E) Si/(In+Si)=0.38 a) Si/(In+Si)=0.12
b) Si/(In+Si)=0.18
c) Si/(In+Si)=0.23
d) Si/(In+Si)=0.30
e) Si/(In+Si)=0.38

FIELD EFFECT TRANSISTOR

TECHNICAL FIELD

The present invention relates to a field effect transistor and, in particular, relates to a field effect transistor utilized as a switching element of an LCD and an organic EL display.

BACKGROUND ART

A field effect transistor (FET) comprises a gate electrode, a source electrode and a drain electrode.

The field effect transistor is an electronically active element in which a voltage is applied to a gate electrode to control current flowing through a channel layer between the source electrode and the drain electrode. In particular, an FET with a thin film as a channel layer, which has undergone film formation on an insulating substrate made of ceramic, glass, plastic or the like, is called a thin film transistor (TFT).

Thin film technology is applied to the above described TFT, which is, therefore, advantageously and easily formed on a substrate having a comparatively large area and is being widely used as a drive element in a flat panel display element such as a liquid crystal display element.

That is, an active liquid crystal display element (ALCD) switches an individual image pixel ON/OFF with a TFT produced on a glass substrate. It is expected that current driving of pixels with a TFT will be effective for a high-performance organic LED display (OLED) in the future. Moreover, a further high-performance liquid crystal display with a peripheral circuit having a function of driving and controlling an entire image, formed on a substrate in the periphery of the image, is already realized.

The most widely used TFT includes a polysilicon film or amorphous silicon film as the channel layer material.

For driving a pixel, an amorphous silicon TFT is already realized for practical use and, for driving and controlling an entire image, a high-performance polysilicon TFT is already realized for practical use.

However, it is difficult to produce an amorphous silicon TFT, a polysilicon TFT, and other TFT's on a substrate such as a plastic plate or foil, since high-temperature processing is demanded for device production.

On the other hand, in recent years, a flexible display is being energetically developed for realization by forming a TFT on a substrate made of a polymer plate and foil for use as a circuit for driving an LCD and an OLED. Attention is focused on organic semiconductors allowing film formation at a low temperature on plastic foil.

For example, research and development on pentacene used as an organic semiconductor film material are going on. Such organic semiconductors have an aromatic ring, thereby attaining significant carrier mobility in the stacking direction of the aromatic ring if the semiconductor is crystallized. For example, in the case of using pentacene as an active layer, carrier mobility is approximately $0.5 \text{ cm}^2(\text{Vs})^{-1}$, which is reportedly equivalent to the carrier mobility in an amorphous-Si MOSFET.

However, the organic semiconductor such as pentacene shows low thermal stability (<150° C.), and no device for practical use has been realized yet.

In addition, recently, attention is being focused on oxide materials for a channel layer of a TFT. For example, a TFT with a channel of ZnO is being developed actively.

The ZnO film allows film formation at a comparatively low temperature. The thin film can be formed on a substrate such as a plastic plate and foil.

However, a ZnO cannot form a stable amorphous film at room temperature but results in a polycrystalline phase. Therefore, the electronic mobility cannot be increased due to scattering on the interfaces between polycrystalline particles (the individual crystals).

In addition, the shape and the mutual connection of the polycrystalline particles are significantly different depending on the film formation method. Therefore, the characteristics may vary widely from TFT element to TFT element and lot to lot.

Recently, a thin film transistor with amorphous oxide of the In—Ga—Zn—O system is reported (K. Nomura et al., *Nature*, vol. 432, pages 488-492 (2004-11)).

This transistor can be produced on a plastic and glass substrate at room temperature. Moreover, the device is of the normally-off type with electric field effect mobility around 6 to 9. In addition, the transistor is characterized by being transparent to visible light.

The mentioned Nomura et al. paper specifically discloses a technology for using an amorphous oxide with a compositional ratio of In:Ga:Zn=1.1:1.1:0.9 (atomic ratio) for a channel layer of a TFT.

This technology uses amorphous oxide with three metal elements, viz., In, Ga and Zn. However, from the point of view of easiness of compositional control and material preparation, it is preferable that the oxide has a smaller number of metal elements.

On the other hand, film formation of an oxide such as ZnO and $In_2O_3$ with one kind of metal element, which is carried out with a technique such as a sputtering method, results generally in a polycrystalline thin film. The polycrystalline phase is apt to give rise to variation in the characteristics of the TFT as described above.

As an example having two metal elements, a report of studies on the In—Zn—O system is known (for example, *Applied Physics Letters*, vol. 89, 062103 (2006)).

However, for the In—Zn—O system, since its resistivity easily changes with time during storage in the air, improvement of the environmental stability is desired. Otherwise, a reported study of the In—Ga—O system uses heat treatment at a comparatively high temperature of 500° C.

DISCLOSURE OF THE INVENTION

An object of the present invention is to provide a field effect transistor using an amorphous oxide constituted by a small number of kinds of element, allowing to be formed at a low temperature applicable to plastic substrate and being excellent in environmental stability such as for storage in the air.

In order to solve the above described problems, the present invention provides a field effect transistor comprising a gate electrode, a source electrode, a drain electrode and a channel layer, to control a current flowing between the source electrode and the drain electrode by applying a voltage to the gate electrode, in which the channel layer is constituted of an amorphous oxide containing In and Si and having a compositional ratio expressed by Si/(In+Si) of not less than 0.05 and not more than 0.40.

In addition, the present invention provides a field effect transistor comprising a gate electrode, a source electrode, a drain electrode and a channel layer, to control a current flowing between the source electrode and the drain electrode by applying a voltage to the gate electrode, in which the channel layer is constituted of an oxide material containing In, Zn and Si and having a compositional ratio of Si expressed by Si/(In+Zn+Si) of not less than 0.05 and not more than 0.40.

In addition, the present invention provides a field effect transistor comprising a gate electrode, a source electrode, a drain electrode, a channel layer and a gate insulating layer in contact with the channel layer, to control a current flowing between the source electrode and the drain electrode by applying a voltage to the gate electrode, in which the channel layer is constituted of an oxide material containing In and Si and having a compositional ratio expressed by Si/(In+Si) of not less than 0.05 and not more than 0.40 and the gate insulating layer is constituted of an oxide or nitride, containing Si.

According to the present invention, the channel layer is formed of a novel material, that is, amorphous oxide containing indium and silicon and, thereby, a thin film transistor showing good characteristics can be realized. In particular, its transistor properties including field effect mobility and S value (the value of a voltage required for increasing current by one order of magnitude) are excellent, and its environmental stability is good.

In addition, there is an advantage that the material cost is inexpensive and the burden on the environment is small since mainly silicon is contained in it.

Further features of the present invention will become apparent from the following description of exemplary embodiments with reference to the attached drawings.

BEST MODES FOR CARRYING OUT THE INVENTION

The best mode for carrying out the present invention will be described below with reference to the accompanying drawings.

The present inventors have devoted themselves to studies on oxide materials made of two metal elements such as oxides containing In and Si as the material for a channel layer of the thin film transistor.

Figure 1:
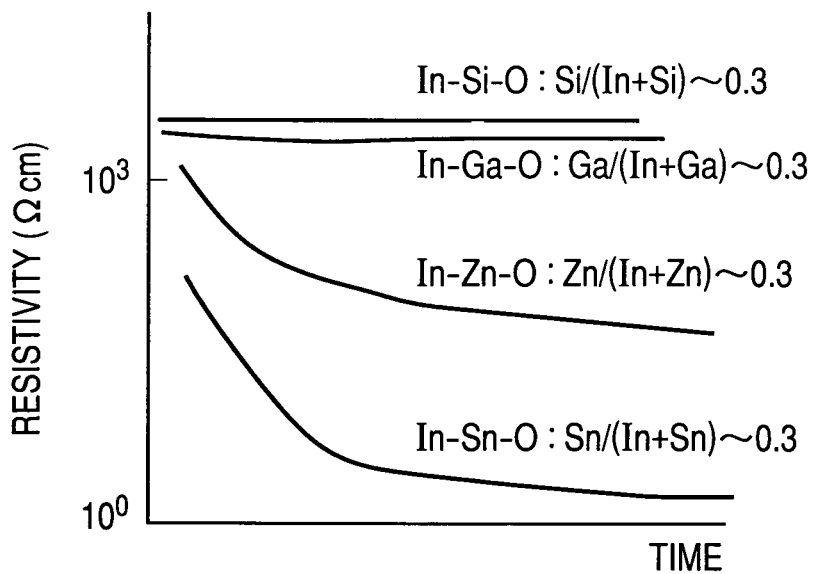
FIG. 1 is a graph illustrating resistivity change with the lapse of time of oxide semiconductor films, formed by a sputtering method.

FIG. 1 is a graph illustrating change with the lapse of time of resistivity of several oxide films formed by a sputtering method.

In FIG. 1, the composition ratio M/(In+M) of In and another metal element M for use is approximately 0.3.

As illustrated in FIG. 1, an oxide (In—Zn—O) constituted of In and Zn and oxide (In—Sn—O) constituted of In and Sn show a greater change in the resistivity with the lapse of time.

On the other hand, an oxide (In—Si—O) constituted of In and Si and oxide (In—Ga—O) constituted of In and Ga apparently give rise to almost no change in the resistivity with the lapse of time.

Thus, the In—Ga—O and In—Si—O oxides are preferred because the oxides can provide excellent stability of resistance.

Next, thin film transistors were experimentally manufactured by making use of the above described materials as a channel. For the In—Zn—O and In—Sn—O oxides, it was difficult to realize a transistor having an ON/OFF ratio with five (5) or more digits.

Figure 2:
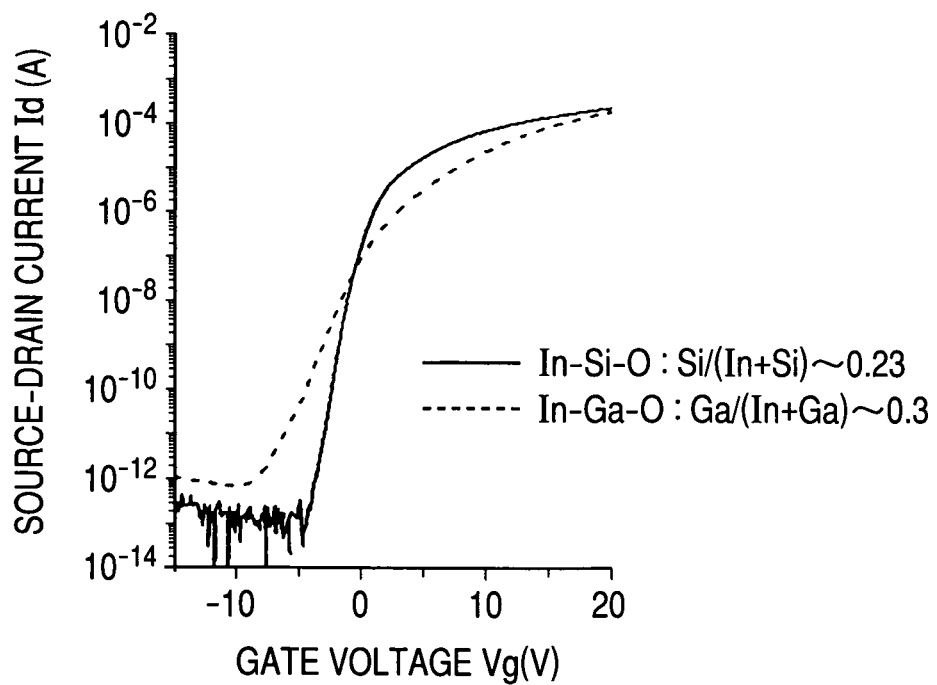
FIG. 2 is a graph illustrating transfer characteristics of a thin film transistor as an embodiment of the present invention.

On the other hand, for the In—Ga—O and In—Si—O oxides, a transistor having an ON/OFF ratio with six (6) or more digits could be realized as illustrated in FIG. 2 with the transfer characteristic (Id-Vg graph).

In particular, as illustrated in FIG. 2, the transfer characteristic (Id-Vg graph) of the In—Si—O TFT is steeper than In—Ga—O TFT in rising of the current Id, which is more appropriate from the point of view of transistor properties.

Thus, the present inventors have found out that oxides containing In and Si can be a preferable material for the channel layer.

In the present invention, the oxide semiconductor may include elements (other than In, Si and O), which may be inevitably contained or may be contained only to such a degree that their presence does not have an adverse affect on the properties.

Next, a thin film transistor of the present invention will be described in detail.
(Thin Film Transistor)

Firstly, what an oxide thin film transistor of the present invention includes will be described.

Figure 3A:
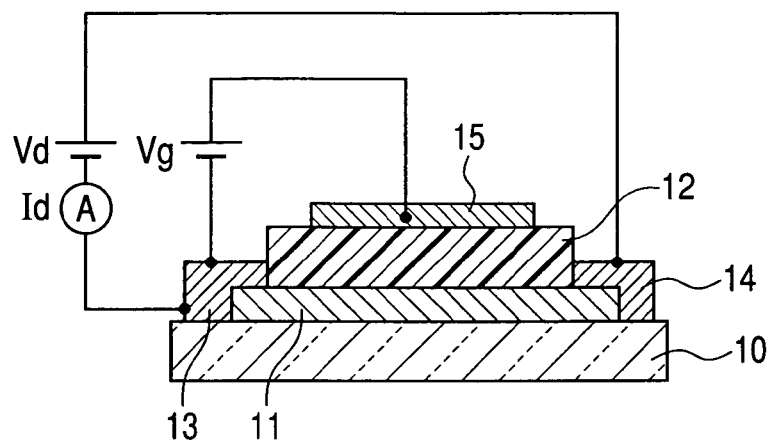
FIGS. 3A, 3B and 3C are sectional views illustrating an example of a structure of a thin film transistor as an embodiment of the present invention.
Figure 3B:
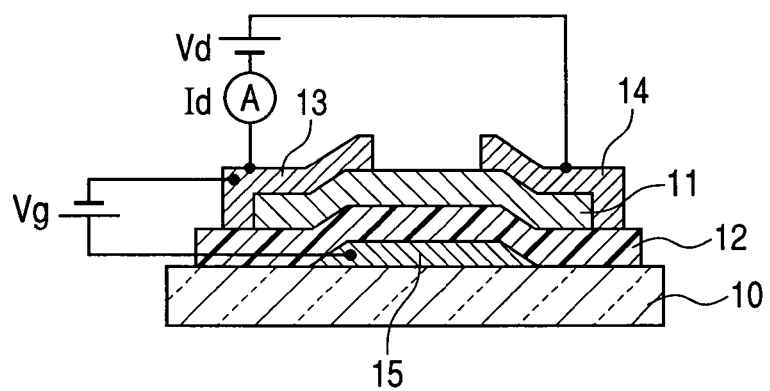
Figure 3C:
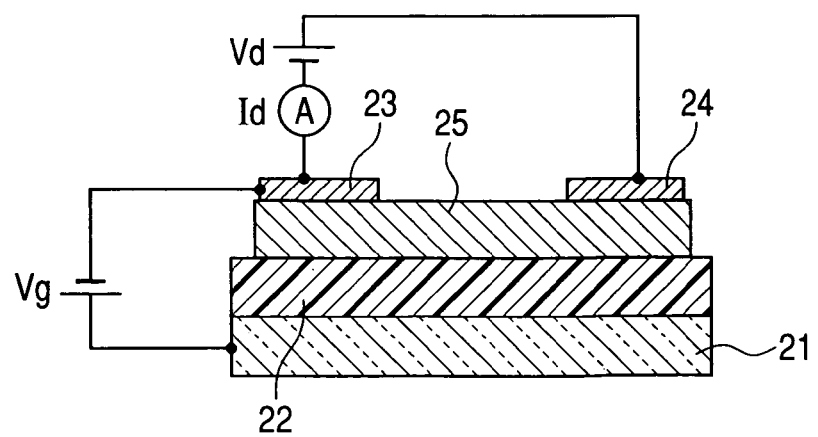

FIGS. 3A, 3B and 3C are sectional views illustrating an example of a thin film transistor as an embodiment of the present invention.

FIGS. 3A, 3B and 3C include a substrate 10, a channel layer 11, a gate insulating layer 12, a source electrode 13, a drain electrode 14 and a gate electrode 15.

A field effect transistor is a three-terminal element comprising a gate electrode 15, a source electrode 13 and a drain electrode 14. Such an electronic active element includes a function of applying a voltage Vg to the gate electrode 15 to control current Id flowing in the channel layer and switch the current Id between the source electrode 13 and the drain electrode 14 ON or OFF.

FIG. 3A shows an example of top gate structure in which the gate insulating layer 12 and the gate electrode 15 are formed in this order on the semiconductor channel layer 11. FIG. 3B shows an example of bottom gate structure in which the gate insulating layer 12 and the semiconductor channel layer 11 formed in this order on the gate electrode 15. FIG. 3C shows an example of another bottom gate type transistor.

FIG. 3C includes substrate 21 (n+Si substrate: also functioning as a gate electrode), an insulating film 22 ($SiO_2$) and a channel layer 25 (oxide). A source electrode 23 and a drain electrode 24 are also included.

In the present embodiment, what is included in the TFT will not be limited to those structures, but any top/bottom gate structure and stagger/inverse staggered structure can be used.

Next, the respective members will be described.

(Channel Layer)

The thin film transistor of the present embodiment is characterized by an amorphous oxide that contains indium and silicon being applied to the channel layer.

In particular, an amorphous oxide (In—Si—O) constituted of In and Si and amorphous oxide (In—Zn—Si—O) constituted of In, Si and Zn are preferable materials. In addition, an amorphous oxide containing In, Sn and Si may be used.

In the case of applying In—Si—O to the channel, a preferable In and Si compositional ratio (atomic ratio) is used.

It is preferred that Si/(In+Si) is not less than 0.05 (5 atom %), since an amorphous thin film can be formed by sputtering method while keeping the substrate temperature at a room temperature. In addition, an amorphous thin film is obtained after an annealing treatment at 300° C.

As described in the foregoing, in the case of the polycrystalline phase, the shape and the mutual connection of the polycrystalline particles are significantly different depending on the film formation method. Therefore, the characteristics of the TFT element will vary from element to element.

Moreover, we fabricated and tested thin film transistors which were obtained by applying an amorphous oxide (In—Si—O) constituted of In and Si to the channel layer. As a result, we found that a preferable material composition (In:Si ratio) for the TFT channel was present.

Figure 4:
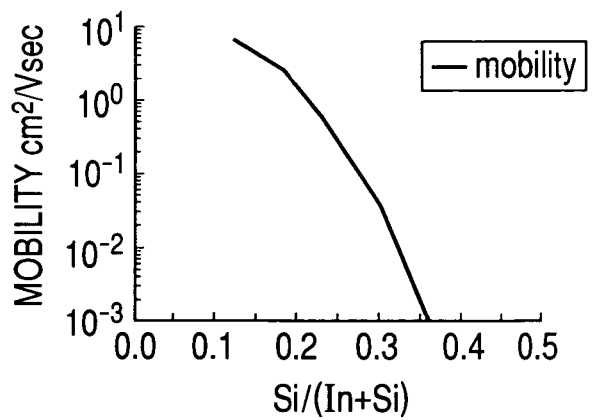
FIG. 4 is a graph illustrating an example of the In—Si composition ratio dependency of field effect mobility.

FIG. 4 is a graph illustrating an experimental result of field effect mobility versus In—Si composition ratio, where an In:Si compositional dependency of a TFT channel was studied.

As shown in FIG. 4, as the Si content is reduced, the field effect mobility apparently increases.

The desired value of field effect mobility depends on the application and may preferably be not less than 0.1 cm$^2$/Vsec for a liquid crystal display apparatus and not less than 1 cm$^2$/Vsec for an organic EL display apparatus.

From such a point of view, the ratio Si/(In+Si) of In and Si may preferably be not more than 0.30 and more preferably be not more than 0.23.

On the other hand, an appropriate circuit is easy to fabricate when a thin film transistor has a threshold voltage Vth of not less than 0 V (or nearly 0).

Figure 5:
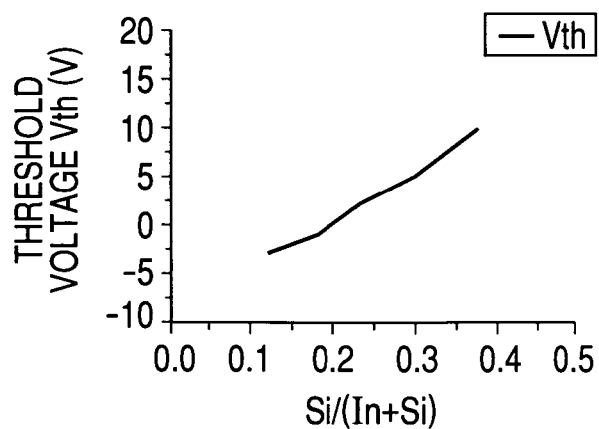
FIG. 5 is a graph illustrating a result of experimental study on the composition dependency of threshold voltage for an In—Si—O thin film transistor.
Figure 6:
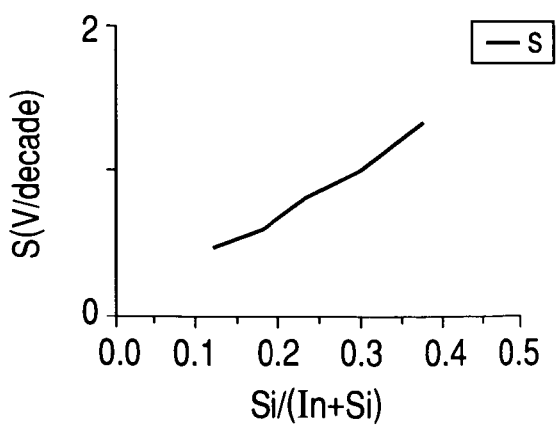
FIG. 6 is a graph illustrating the In:Si ratio dependency of the S value.

FIG. 5 is a graph showing a result of experimental study on composition dependency of threshold voltage of an In—Si—O system thin film transistor. FIG. 6 is a graph showing the In:Si ratio dependency of the S value.

As shown in FIG. 5, if Si/(In+Si) is not less than 0.15, the threshold voltage Vth is a positive value (or nearly 0), which is preferred.

In addition, as shown in FIG. 6, a small value between 0.15 and 0.25 can be obtained for the S value.

Based on the foregoing description, in the case of applying In—Si—O to a channel layer of a thin film transistor, the atomic ratios of In and Si, that is, Si/(In+Si), may preferably be not less than 0.05 (5 atom %) and not more than 0.40, more preferably not less than 0.15 and not more than 0.30, and particularly preferably not less than 0.15 and not more than 0.23.

In addition, in the case of applying In—Si—Zn—O to a channel layer of a thin film transistor, the atomic ratios of In, Si and Zn, that is, Si/(In+Si+Zn), may preferably be not less than 0.05 and not more than 0.40.

The oxide (channel layer) of the present embodiment is within a range from 10 nm to 200 nm, may preferably be within a range from 20 nm to 100 nm, and more preferably may be within a range from 25 nm to 70 nm.

Good TFT properties can be obtained preferably by applying an amorphous oxide having an electric conductivity of not more than 10 S/cm and not less than 0.0001 S/cm to the channel layer.

Such an electric conductivity may preferably be achieved by forming an amorphous oxide film having an electron carrier concentration of around $10^{14}$ to $10^{18}$ per cm$^3$ although it depends upon the material composition.

When the electric conductivity is not less than 10 S/cm, a normally-OFF transistor cannot be fabricated. In addition, the ON/OFF ratio cannot be made large.

In an extreme case, even if a gate voltage is applied, current flow between source-to-drain electrodes is not put ON/OFF, that is, no transistor operation is exhibited.

On the other hand, in the case of an insulating body, that is, with an electric conductivity of not more than 0.0001 S/cm, the ON current cannot be made large. In an extreme case, even if a gate voltage is applied, current flow between source-to-drain electrodes is not put ON/OFF, that is, no transistor operation is exhibited.

The electric conductivity of an oxide to be applied to the channel layer can be controlled by controlling the compositional ratio of metal elements, the oxygen partial pressure at the time of film formation and the annealing conditions after a thin film is formed.

In particular, the oxygen partial pressure at the time of film formation is controlled to control mainly the oxygen deficiency in the film, and thereby, the electron carrier concentration can be controlled.

(Gate Insulating Layer)

There is no particular limitation on the material for the gate insulating layer 12 as long as the material exhibits good insulating property in a transistor applicable to the present embodiment. Preferably, with a thin film containing silicon as the principal component being used as a gate insulating layer 12, a thin film transistor can exhibit good properties.

The reason for the above is not confirmed, but is considered to be that a good interface is formed between a channel layer containing silicon and a gate insulating layer containing silicon as the principal component.

For example, the gate insulating layer 12 may preferably be constituted of an oxide or nitride. Specifically, preferable are silicon oxide SiO$_x$, silicon nitride SiN$_x$ and silicon oxynitride SiO$_x$N$_y$. Otherwise, a compound oxide with silicon as the principal component such as Si—Hf—O, Si—Al—O and Si—Y—O may be used.

Application of such a well insulating thin film allows a leakage current of approximately $10^{-7}$ ampere between the source and gate electrodes and between drain and gate electrodes. The thickness of the gate insulating layer is around 50 to 300 nm.

(Electrode)

There is no particular limitation on the materials for the source electrode 13, the drain electrode 14 and the gate electrode 15 as long as a good electrically conductive property and electrical connection to the channel layer can be provided.

For example, transparent conductive films such as In$_2$O$_3$:Sn and ZnO and metal electrodes such as made of Au, Ni, W, Mo, Ag and Pt can be used. In addition, arbitrary stacked structures including stacked structures of Au and Ti may be used.

(Substrate)

As a substrate 10 may be used a glass substrate, a plastic substrate and a plastic foil.

The above described channel layer and the gate insulating layer are transparent to visible light. Where transparent materials are used as the above described electrodes and substrate, a transparent thin film transistor can be produced.
(Fabrication Method)

As a method of film formation of oxide thin film, gas phase methods such as a sputtering method (SP method), a pulse laser vapor deposition method (PLD method) and an electron beam vapor deposition method may be used. Here, among the gas phase methods, the SP method is more appropriate from the point of view of mass productivity. However, the film formation method used in the invention will not be limited to those methods.

During the film formation, the substrate can be kept at approximately room temperature in the state where no heat is applied intentionally.

Since this technique can be carried out in a low temperature process, a thin film transistor can be fabricated on a substrate such as a plastic plate and foil.

A semiconductor apparatus (active matrix substrate) in which such thin film transistors are arranged may be realized. The transparent semiconductor apparatus may be realized when a transparent substrate and a transparent amorphous oxide TFT are used. As a result, when the transparent semiconductor apparatus is applied to a display apparatus, the aperture ratio thereof can be increased.

In particular, when the semiconductor apparatus is used in an organic EL display, a configuration of picking up light also from the substrate side (bottom emission) can be adopted.

The semiconductor apparatus of the present embodiment can be considered to be usable for various uses such as an ID tag and IC tag.
(Characteristics)

Here, with FIGS. 7A and 7B, the characteristics of the field effect transistor of the present embodiment will be described.

The field effect transistor is a three-terminal element comprising a gate electrode 15, a source electrode 13 and a drain electrode 14.

The field effect transistor is an electronic active element capable of fulfilling a function of applying a voltage Vg to the gate electrode 15 to control current Id flowing in the channel layer and switch the current Id between the source electrode 13 and the drain electrode 14.

At the time of applying a voltage Vd of about 5 to 20 V between source-to-drain electrodes, the gate voltage Vg is switched between 0 V and 5 to 20 V, thereby controlling (switching ON/OFF) current Id between the source-to-drain electrodes.

Figure 7A:
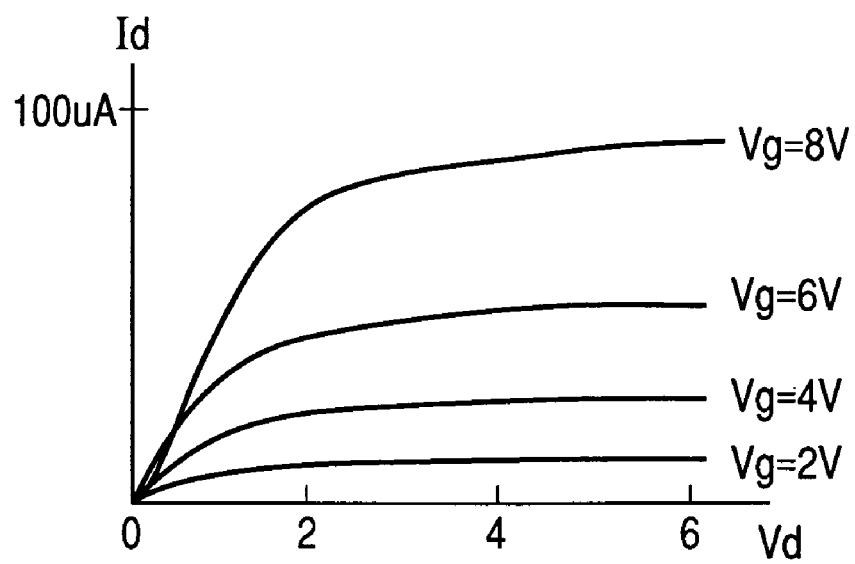
FIGS. 7A and 7B are graphs exemplifying the characteristics of a thin film transistor as an embodiment of the present invention.
Figure 7B:
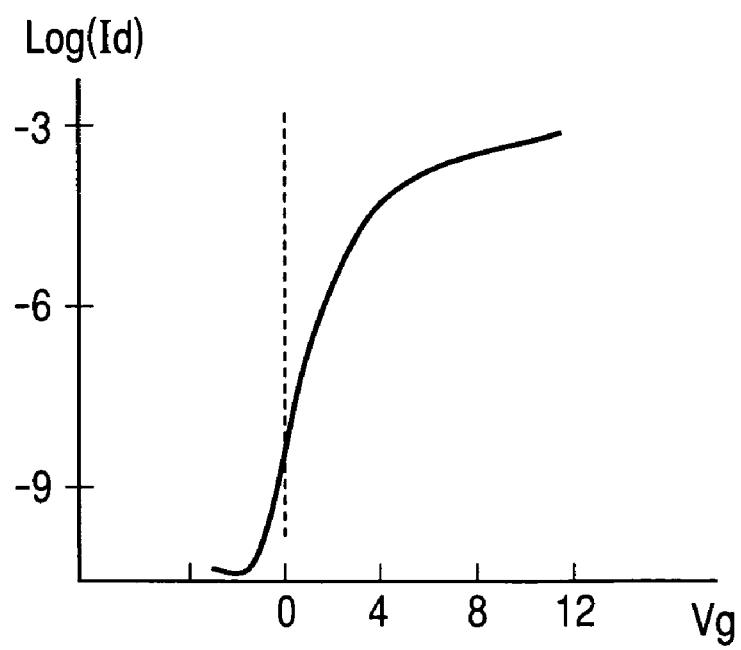

FIG. 7A exemplifies Id-Vd characteristics at various Vg; and FIG. 7B exemplifies Id-Vg characteristic (transfer characteristic) at Vd=6 V.

Transistor performance can be expressed as, for example, field effect mobility μ, threshold voltage (Vth), ON/OFF ratio and S value.

The field effect mobility can be determined from the properties of a linear region and a saturated region.

Several methods of determining the field effect mobility are available. For example, the field effect mobility is determined from an inclination of the √Id-Vg graph. In the present specification, the technique hereof is adopted for assessment unless otherwise stated.

Several methods of determining the threshold voltage are available. For example, there may be mentioned a method of determining threshold voltage Vth from the x-intercept of the √Id-Vg graph.

The ON/OFF ratio can be obtained from the ratio of the largest Id and the smallest Id in the transfer characteristics.

The S value can be determined from the reciprocal of the inclination of a graph of Log(Id)-Vd which is made based on results of the transfer characteristics.

Differences in the transistor properties are not limited to the ones described above, but can be expressed otherwise with various kinds of parameters.

EXAMPLES

Example 1

The present example is an example of producing a top gate type TFT illustrated in FIG. 3A in which a channel layer is an amorphous oxide of In—Si—O system.

At first, an amorphous oxide film of the In—Si—O system is formed as the channel layer on a glass substrate (product 1737 made by Corning Incorporated).

In the present example, the amorphous oxide film of the In—Si—O system is formed by radio-frequency sputtering method in the mixed atmosphere of argon gas and oxygen gas.

Figure 8:
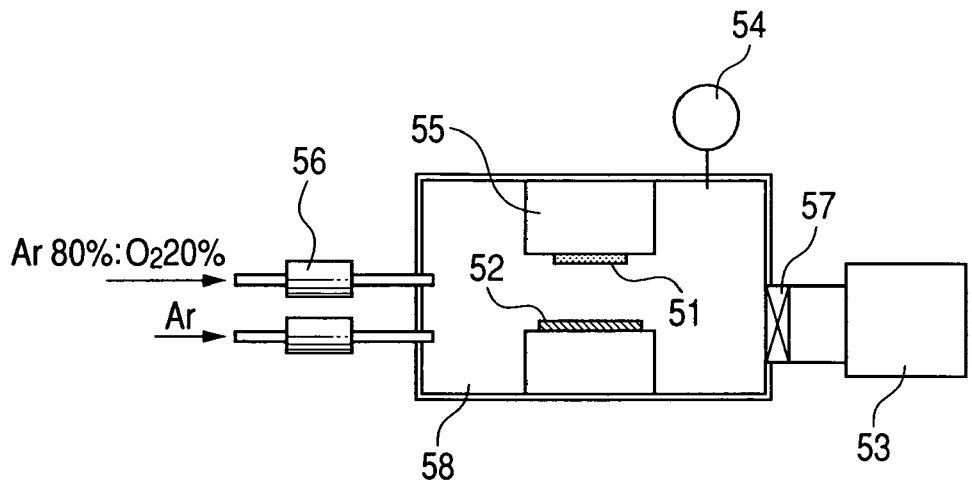
FIG. 8 is a schematic illustration of a thin film formation apparatus used for producing a thin film transistor as an embodiment of the present invention.

A sputtering film formation apparatus illustrated in FIG. 8 is used.

FIG. 8 includes a test sample 51, a target (material source) 52, a vacuum pump 53, a vacuum gauge 54, a substrate holding unit 55, gas flow controlling units 56 provided for respective gas introductory systems, a pressure controlling unit 57 and a film formation chamber 58.

The vacuum pump 53 serves as an exhaust unit for exhausting the gas from the interior of the film formation chamber 58. The substrate holding unit 55 retains a substrate on which oxide film is formed inside the film formation chamber. The solid material source (target) 52 is arranged opposite to the substrate holding unit. Moreover, an energy source (radio-frequency power supply not shown in the drawing) for evaporating a material from the solid material source and a unit for supplying gas to inside the film formation chamber are disposed.

The gas introductory system includes two systems of argon and a mixed gas of argon and oxygen ($Ar:O_2=95:5$). A predetermined gas atmosphere can be obtained in the film formation chamber by means of the gas flow controlling unit 56 enabling control of each gas flow independently and the pressure controlling unit 57 for controlling exhaust speed.

In the present example, $In_2O_3$ and $SiO_2$ targets in 2-inch size are used as a target (material source) and an In—Si—O film is formed by simultaneous sputtering. The input RF powers are respectively 70 W and 65 W. The total pressure of the atmosphere at the time of film formation is 0.4 Pa and the gas flow ratio at that occasion is $Ar:O_2=100:1$. The film formation rate is 12 nm/min. In addition, the substrate temperature is 25° C. Subsequently, an annealing process at 280° C. for 30 minutes is carried out in the atmosphere.

For the obtained film, low-angular incident X-ray diffraction measurement was carried out (a thin film method with incident angle of 0.5 degree). No clear diffractive peak was detected to find that the produced film of the In—Si—O system is amorphous.

Moreover, spectroscopic ellipsometric measurement is carried out to analyze a pattern. The root-mean-square roughness (Rrms) of the thin film and its film thickness turned to be approximately 0.5 nm and approximately 40 nm, respectively. As a result of fluorescent X-ray (XRF) analysis, the metal compositional ratio of the thin film was In:Si=8:2.

In addition, the electric conductivity is estimated to be about $10^{-2}$ S/cm; the electron carrier concentration is estimated to be $4\times10^{16}/cm^3$; and the electronic mobility is estimated to be about 3 $cm^2/V\cdot second$.

Next, the drain electrode 14 and the source electrode 13 were patterned and formed by the photolithographic method and the liftoff technique. The respective electrode materials are stacked film made of Au and Ti with a thickness of 40 nm and 5 nm, respectively.

Next, the gate insulating layer 12 was patterned and formed by the photolithographic method and the liftoff technique. As the gate insulating layer, an $SiO_2$ film was formed by sputtering method and its thickness is 150 nm. In addition, the relative permittivity of the $SiO_2$ film is approximately 3.7.

Moreover, the gate electrode 15 was formed by the photolithographic method and the liftoff technique. The channel length is 50 μm and the channel width is 200 μm. The electrode material is Au with a thickness of 30 nm.

(Assessment on Characteristics of TFT)

FIGS. 7A and 7B exemplify current-voltage characteristic of a TFT measured at room temperature.

FIG. 7A shows Id-Vd characteristic and FIG. 7B shows Id-Vg characteristic.

As shown in FIG. 7A, a constant gate voltage Vg was applied to measure the drain voltage Vd dependency of the source-to-drain current Id accompanied by variation of the drain voltage Vd, and as a result, saturation (pinch off) took place with around Vd=6 V.

Investigation on the gain characteristics revealed that the threshold value of the gate voltage $V_G$ was approximately −0.5 V at the time of applying Vd=6 V. In addition, at the time of Vg=10 V, a current of around Id=$1.0 \times 10^{-4}$ A flowed.

The ON/OFF ratio of the transistor was not less than $10^7$. In addition, the field effect mobility was calculated from the output characteristics and a field effect mobility of approximately 5 $cm^2 (Vs)^{-1}$ was obtained in the saturated region.

In the present example, a TFT could be produced with good reproducibility and when a plurality of TFTs was produced, there was very little variation in the characteristics.

Thus, by applying a novel amorphous oxide, that is, In—Si—O to the channel layer, good transistor characteristics could be realized.

In particular, the In—Si—O system is more advantageous than the In—Ga—Zn—O system in that the former has a fewer number of constituent elements.

In addition, the thin film transistor of the present invention makes use of a silicon element which is inexpensive with regard to the cost for raw material. Therefore, the material cost can be reduced. Moreover, a thin film transistor can be realized with constituent elements with a small load to the environment.

In addition, similarly, a TFT with a thin film made of alumina as the gate insulating layer was experimentally produced and was assessed. The mobility was approximately 1.5 $cm^2(Vs)^{-1}$.

Thus, a gate insulating layer with silicon as the principal component is preferably used for the TFT with the In—Si—O channel.

The field effect transistor of the present invention which is produced at a low cost of material and provided with stable characteristics is expected to be applied to an operating circuit of an organic light-emitting diode display.

Example 2

The present example is an example of experimental study on the composition dependency of In and Si in a thin film transistor with a channel layer containing In and Si as the principal components.

In the present example, in order to study the material composition dependency of the channel layer, the combinatorial method is adopted for film formation. That is, experimental study is made with a technique of producing thin films of oxides having various compositions on one substrate at one time by the sputtering method. However, this technique does not necessarily have to be used for purposes of study. The film formation may be carried out by preparing a material source (target) having a predetermined composition. By controlling the input power to each of a plurality of targets, a thin film with a desired composition may be formed.

In—Si—O films were formed by using sputtering apparatus with three cathodes. Since the targets are arranged in an oblique direction relative to the substrate, the composition of a film formed on the substrate surface varies according to difference in distance from the target (i.e., the position in the substrate). As a result, a thin film with binary and wide composition distribution in the substrate surface can be obtained. For the film production of In—Si—O film, two targets of $In_2O_3$ and one target of $SiO_2$ were simultaneous powered (sputtered).

The input RF powers to the $In_2O_3$ and $SiO_2$ targets are 35 W and 65 W, respectively. The total pressure of the atmosphere at the time of film formation is 0.35 Pa. The gas flow ratio at that time is $Ar:O_2$=100:1. The substrate temperature is 25° C.

The physical properties of the produced film were assessed by fluorescent X-ray analysis, spectroscopic ellipsometry, X-ray diffraction and four-point probe resistance measurement. In addition, bottom-gate top-contact type TFTs with various In—Si—O compositions were experimentally produced by using combinatorial techniques. The device characteristics were assessed at room temperature.

The film thickness was measured by spectroscopic ellipsometry. As a result, the thickness of the amorphous oxide film was approximately 50 nm.

The In—Si—O film produced was confirmed to be amorphous with the Si/(In+Si) being in a range of not less than 0.05 by X-ray diffraction (XRD) measurement.

Moreover, in the case of a film with the Si composition being smaller than 0.05, a crystalline diffraction peak was occasionally observed. Consequently, with an In—Si—O film with Si/(In+Si) being made not less than 0.05, an amorphous thin film was found to be obtainable.

The resistivity of the In—Si—O film was from the sheet resistance of the films measured by four-point probe method and the film thickness by spectroscopic ellipsometry. The resistivity was confirmed to be varied according to the In—Si composition ratio. It was found that the films with In-rich composition show relatively low resistance. The films with Si-rich composition show relatively high resistance.

Next, the resistivity of In—Si—O films, which were formed by varying the oxygen flow amount in the film formation atmosphere, was determined to find that the In—Si—O films show high resistance as the oxygen flow amount increases. This is considered to be due to the decrease in the oxygen deficiency and accompanying loss of the electron carrier density. In addition, the composition range providing a resistance appropriate for a TFT active layer was found to vary for the oxygen flow amount.

The results of the change in resistivity with the lapse of time are shown in FIG. 1. As to the thin film of In—Si—O system, the change in resistivity with the lapse of time was not observed over a broad range of composition. On the other hand, as to an In—Zn—O film and In—Sn—O film which were formed in the same manner, the films were found to tend to decrease in the resistivity according to the lapse of time. As a result, the semi-conductive In—Si—O film was found to be excellent in the stability to environments.

Next, the characteristics of a field effect transistor (FET) with an In—Si—O film as the n-type channel layer and its composition dependency were examined. The transistor has a configuration of a bottom gate type illustrated in FIG. 3C.

After film production of an In—Si—O film with composition gradiention on a Si substrate with a thermally-oxidized film, patterning and electrode forming were carried out to form, on a sheet of substrate, a great variety of TFTs with active layers having different compositions.

A great number of FET's formed on 3-inch wafers were produced and the characteristics thereof were assessed. $N^+$—Si, $SiO_2$ and Au/Ti are used for the gate electrode, the insulating film and the source-drain electrode, respectively.

The channel width and the channel length are 150 μm and 10 μm, respectively. The source-drain voltage used for the FET assessment is 6 V.

In the TFT characteristics assessment, the electronic mobility is determined by the inclination of $\sqrt{Id}$ (Id: drain current) to the gate voltage (Vg) and the current ON/OFF ratio is determined by the ratio of the maximum value of Id and the minimum value of Id in Id-Vg graph.

In addition, when $\sqrt{Id}$ is plotted for Vg, the intercept on the Vg axis is regarded as a threshold voltage. The minimum value of dVg/d(log Id) is regarded as the S value (value of a voltage required for increasing current by one order of magnitude).

By assessing the TFT characteristics at various positions on the substrate, variation of TFT characteristics according to In—Si composition ratio was examined.

Figure 9:
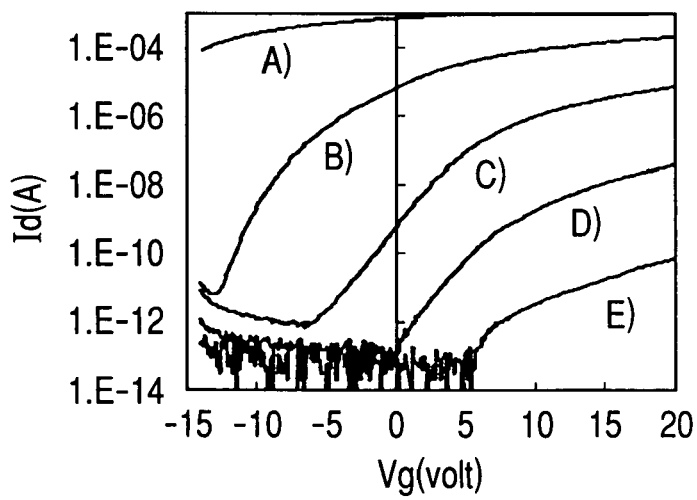
FIG. 9 is a graph illustrating Id-Vg characteristics for various compositions.

This reveals that the TFT characteristics vary according to the positions on the substrate, that is, In—Si compositional ratio. FIG. 9 is a graph showing Id-Vg characteristics for various compositions.

In the In-rich compositions (A and B, for example), it was found that while the ON current was large, the OFF current was large and the threshold value became negative.

On the other hand, in the Si-rich compositions (D and E, for example), the OFF current tended to be small and the ON current also tended to be small. The threshold voltage took a positive value and "normally OFF characteristic" was obtained. However, at the time of ON, the drain current is small and the field effect mobility is small.

In the case of the TFT C) with Si/(In+Si) being 0.23, comparatively good properties with the ON/OFF ratio exceeding six (6) digits is obtained.

The properties are improved by subjecting the above described TFTs to an annealing process at 300° C.

Figure 10:
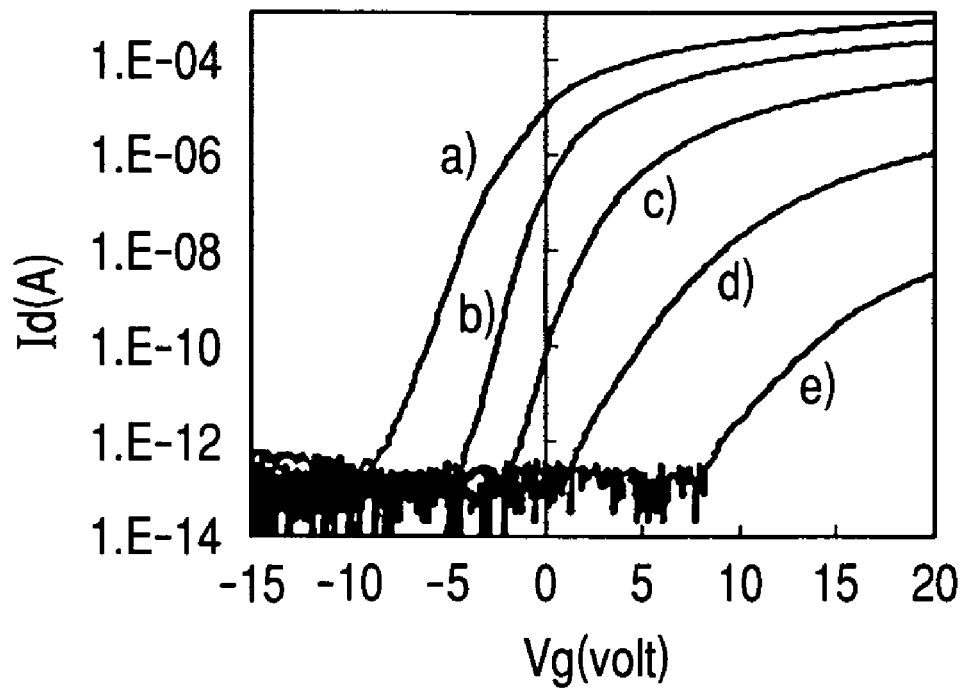
FIG. 10 is a graph illustrating the TFT (Id-Vg) characteristic after annealing.

FIG. 10 is a graph showing TFT characteristics (Id-Vg curves) after the annealing treatment was carried out.

The composition dependency of the TFT characteristics denotes the same tendency as that before the annealing is carried out. However, the composition range indicating good characteristics is found to be expanded.

For example, in the composition ratio of b) Si/(In+Si)=0.18 and c) Si/(In+Si)=0.23, good characteristics are exhibited.

FIG. 4 illustrates In:Si composition dependency of the field effect mobility.

It turns out that as the content of Si is made smaller, the field effect mobility becomes larger. With the ratio of In and Si, Si/(In+Si) being not more than 0.3, a field effect mobility of not less than 0.1 $cm^2$/Vsec is obtained. In addition, with Si/(In+Si) being not more than 0.23, a field effect mobility of not less than 1 $cm^2$/Vsec is obtained.

FIG. 5 shows the composition dependency of the threshold voltage. TFTs with the threshold voltage Vth being a value of not less than 0 V (or nearly 0 V) are favored to make electrical circuits. As shown in FIG. 5, with Si/(In+Si) being not less than 0.15, preferably the threshold voltage Vth can take a positive value (or nearly 0).

In addition, FIG. 6 shows the composition dependency of the S value. The small S value is found to be preferably obtained with Si/(In+Si) between 0.15 and 0.30.

An example of a TFT provided with good transistor characteristics is shown in FIG. 2. The electron mobility, the current ON/OFF ratio, the threshold value and the S value are respectively as follows. That is, those values are 3 $cm^2(V·s)^{-1}$, $1\times10^9$, 0 V and 0.5 V/dec.

FIG. 2 also shows the transfer characteristics of In—Ga—O TFT subjected to experimental study with a likewise technique. It turns out that the In—Si—O TFT is superior to the In—Ga—O TFT in the rising (sub-threshold) property of the transistor and with a small S value.

Example 3

The present example is an example of applying an amorphous In—Zn—Si—O oxide semiconductor to the channel layer.

In addition, the present example is an example of producing a TFT having a configuration shown in FIG. 3B on a plastic substrate.

A polyethylene terephthalate (PET) film is used as the substrate. The channel length of the transistor is 60 μm. The channel width is 180 μm.

At first, a gate electrode 15 and a gate insulating layer 12 are patterned and formed on a PET substrate 10 by the photolithographic method and the liftoff technique.

The gate electrode 15 is made of a Ta film with a thickness of 50 nm. The gate insulating layer is a $SiO_xN_y$ film with a thickness of 150 nm formed by the sputtering method. The relative permittivity of the $SiO_xN_y$ film is approximately 6.

Next, the channel layer of the transistor was patterned and formed by the photolithographic method and the liftoff technique. The channel layer is made of an amorphous oxide 11a of In—Zn—Si—O system. Its metallic composition is In:Zn:Si=4:6:1.

The above described amorphous oxide film of In—Si—O system is formed by radio-frequency sputtering method in a mixed atmosphere of argon gas and oxygen gas.

In the present example, three targets (material sources) are used to form film. The three targets are respectively 2-inch sized $In_2O_3$, $SiO_2$ and ZnO sintered compacts. By controlling input RF powers to the respective targets, an oxide thin film with a desired In:Zn:Si compositional ratio can be obtained. The total pressure of the atmosphere is 0.5 Pa and the gas flow ratio at that time is Ar:$O_2$=100:1. The substrate temperature is 25° C.

The oxide films 11a and 11b are amorphous films since no clear diffraction peak is detected in the X-ray diffraction (a thin film method with incident angle of 0.5 degree). The thickness of the amorphous oxide film is approximately 30 nm.

In addition, as a result of analysis on optical absorption spectrum, the optical band-gap of the produced amorphous oxide film is approximately 3 eV and is transparent to visible light.

In addition, the source electrode and the drain electrode are formed, which are transparent conductive film made of $In_2O_3$:Sn. The thickness is 100 nm.

(Assessment on Characteristics of TFT)

The TFT formed on PET film is measured at room temperature. The ON/OFF ratio of the transistor is not less than $10^9$. In addition, the field effect mobility is calculated and is found to be approximately 7 $cm^2(Vs)^{-1}$.

In addition, the thin film transistor of the present embodiment obtained by applying In—Zn—Si as a channel provides high performance and is highly stable to the environment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-230381, filed Sep. 5, 2007 and 2008-146890, filed Jun. 4, 2008, which are hereby incorporated by reference in their entirety.

The invention claimed is:

1. A field effect transistor comprising:
a gate electrode;
a source electrode;
a drain electrode; and
a channel layer comprising an oxide material containing In and Si and having a compositional ratio expressed by Si/(In+Si) of not less than 0.05 and not more than 0.40.

2. The field effect transistor according to claim 1, wherein the compositional ratio expressed by Si/(In+Si) is not less than 0.15 and not more than 0.30.

3. The field effect transistor according to claim 1, wherein the compositional ratio expressed by Si/(In+Si) is not less than 0.15 and not more than 0.23.

4. A field effect transistor comprising:
a gate electrode;
a source electrode;
a drain electrode; and
a channel layer comprising an oxide material containing In, Zn and Si and having a compositional ratio of Si expressed by Si/(In+Zn+Si) of not less than 0.05 and not more than 0.40.

5. A field effect transistor comprising:
a gate electrode;
a source electrode;
a drain electrode;
a channel layer; and
a gate insulating layer in contact with said channel layer,
wherein said channel layer comprises an oxide material containing In and Si and having a compositional ratio expressed by Si/(In+Si) of not less than 0.05 and not more than 0.40, and
wherein said gate insulating layer comprises of an oxide or nitride, containing Si.

6. The field effect transistor according to claim 5, wherein said gate insulating layer comprises a silicon oxide.

7. The field effect transistor according to claim 6, wherein said channel layer and the gate insulating layer are formed by a sputtering method.

8. The field effect transistor according to claim 1, wherein said oxide material is an amorphous oxide material.

9. The field effect transistor according to claim 4, wherein said the oxide material is an amorphous oxide material.

10. The field effect transistor according to claim 5, wherein said oxide material is an amorphous oxide material.

* * * * *